United States Patent
Zayats et al.

(10) Patent No.: US 11,898,905 B2
(45) Date of Patent: Feb. 13, 2024

(54) PLASMONIC METAMATERIAL STRUCTURE

(71) Applicant: KING'S COLLEGE LONDON, London (GB)

(72) Inventors: Anatoly Zayats, London (GB); Pan Wang, London (GB); Mazhar Nasir, London (GB); Wayne Dickson, London (GB); Alexey Krasavin, London (GB)

(73) Assignee: King's College London, London (GB)

( * ) Notice: Subject to any disclaimer, the term of this patent is extended or adjusted under 35 U.S.C. 154(b) by 1179 days.

(21) Appl. No.: 16/479,511

(22) PCT Filed: Jan. 18, 2018

(86) PCT No.: PCT/GB2018/050138
§ 371 (c)(1),
(2) Date: Jul. 19, 2019

(87) PCT Pub. No.: WO2018/134592
PCT Pub. Date: Jul. 26, 2018

(65) Prior Publication Data
US 2023/0074749 A1    Mar. 9, 2023

(30) Foreign Application Priority Data

Jan. 20, 2017 (GB) .................................... 1700960

(51) Int. Cl.
*H01Q 15/00* (2006.01)
*G01J 1/44* (2006.01)

(52) U.S. Cl.
CPC ............ *G01J 1/44* (2013.01); *H01Q 15/0086* (2013.01)

(58) Field of Classification Search
CPC ................................ G01J 1/44; H01Q 15/0086
See application file for complete search history.

(56) References Cited

U.S. PATENT DOCUMENTS 8,780,431 B1 * 7/2014 Kekatpure ............. G02B 5/008
359/245
8,816,358 B1    8/2014 Tsai et al.
(Continued)

FOREIGN PATENT DOCUMENTS

WO    WO 2014/184530 A1    11/2014

OTHER PUBLICATIONS

Lambe et al.: "Light emissions from Inelastic Electron Tunneling," Physical Review Letters, vol. 37, No. 14, Oct. 4, 1976, pp. 923-925, XP055465758, United States.
(Continued)

*Primary Examiner* — Seung C Sohn
(74) *Attorney, Agent, or Firm* — Keller Preece PLLC

(57) ABSTRACT

Aspects and embodiments relate to a plasmonic metamaterial structure, applications and devices including that plasmonic metamaterial structure, and a method of forming that plasmonic metamaterial structure. Aspects and embodiments provide a plasmonic metamaterial structure which comprises: a plurality of optical antenna elements. The plurality of optical antenna elements comprise: a first electrode, a second electrode and a plasmonic nanostructure element located between the first and second electrode to form an electron tunnelling junction between the first and second electrodes. The plurality of optical antenna elements are configured such that the electromagnetic field of one optical antenna element spatially overlaps that of adjacent optical antenna elements and adjacent optical antenna elements are electromagnetically coupled to allow the plurality of optical antenna elements to act as a plasmonic metamaterial. Aspects and embodiments also provide devices including that plasmonic metamaterial structure, and a method of forming that plasmonic metamaterial structure. Aspects and embodiments recognise that the sensitivity of (Continued)

an electron tunnelling junction, coupled with provision of a plurality of optical antenna elements may provide a practical structure which can provide sensing platforms, modulation, light source and nanoscale light source devices and applications.

19 Claims, 8 Drawing Sheets

(56) References Cited

U.S. PATENT DOCUMENTS

| | | |
|---|---|---|
| 9,368,667 B1 | 6/2016 | Kim et al. |
| 10,612,971 B2 * | 4/2020 | Huang ............... H01L 31/101 |
| 2010/0066238 A1 | 3/2010 | Conway et al. |
| 2011/0163920 A1 | 7/2011 | Cutler |
| 2012/0154800 A1 | 6/2012 | Natelson et al. |

OTHER PUBLICATIONS

Atkinson et al.: "Anisotropic optical properties of arrays of gold nanorods embedded in alumina," Physical Review. B, Condensed Matter and Materials Physics, American Physical Society, US, vol. 73, Jun. 5, 2006, pp. 235402-1, XP002438125, ISSN: 1098-0121, DOI: 10.1103/PHYSREVB.73.235402.

Application No. GB1700960.6 Search Report under Section 17 dated Jul. 20, 2017 (2 pages).

* cited by examiner

PLASMONIC METAMATERIAL STRUCTURE

FIELD OF THE INVENTION

Aspects and embodiments relate to a plasmonic metamaterial structure, applications and devices including that plasmonic metamaterial structure, and a method of forming that plasmonic metamaterial structure.

BACKGROUND

Applying a bias voltage between two electrodes separated by a nanometre-scale insulating gap, can cause a current to flow between the electrodes due to quantum mechanical electron tunnelling. The nature of that resulting current depends exponentially on insulating gap size and, as a result, even an atomic-level variation in the insulating gap size can produce measurable change in the tunnelling current. The tunnelling current also depends on the electronic and structural properties of a medium which exists in the insulating gap.

As a result, tunnelling currents can be used as a highly sensitive mechanism for sensing applications; for example: probing molecule binding events in the junctions at a single-molecule level, studying fundamental interfacial processes, or detecting dynamic chemical reactions.

It is desired to provide a structure which allows for practical application of one or more of the properties of tunnelling currents in nanometre scale insulating gaps between electrodes.

SUMMARY

A first aspect provides a plasmonic metamaterial structure comprising: a plurality of optical antenna elements comprising: a first electrode, a second electrode and a plasmonic nanostructure element located between the first and second electrode to form an electron tunnelling junction between the first and second electrodes; the plurality of optical antenna elements being configured such that the electromagnetic field of one optical antenna element spatially overlaps that of adjacent optical antenna elements and adjacent optical antenna elements are electromagnetically coupled to allow the plurality of optical antenna elements to act as a plasmonic metamaterial.

The first aspect recognises that the properties of a nanometre scale insulating gap can be paired with the properties of an optical antenna. Metal-insulator-metal tunnel junctions may be formed such that they may generate light. That light generation phenomenon occurs due to excitation of surface plasmons in junctions by inelastic tunnelling of electrons. In a metal-insulator-metal structure the electron-photon conversion efficiency is typically limited to around $10^{-5}$. The first aspect recognises that optical antennas can be used to strongly enhance electron-photon conversion efficiency and control related light emission which may open up opportunities for practical applications of tunnelling-electron-driven plasmonic devices.

The first aspect recognises that a plasmonic metamaterial of appropriate form and, if the form of the structure is chosen appropriately, elements of the structure may act perfectly both as a tunnel tip (like a STM probe) and an optical antenna, making a plasmonic metamaterial structure an ideal platform in which to form a plurality of tunnel junctions to allow for high-efficiency and, for example, device-scale electrical excitation of plasmons.

The first aspect may provide a plasmonic metamaterial structure. That structure may be incorporated in various devices and may have a wide variety of applications as set out further in relation to embodiments. The structure may comprise a plurality of optical antenna elements. Provision of a plurality of optical antenna elements may allow for enhanced optical and/or electrical response of a structure in comparison to a structure comprising a single optical antenna element and allows for easy detection of signal due to the improvement of overall signal. Each antenna element may comprise: a first electrode, a second electrode and a plasmonic nanostructure element located between the first and second electrode to form an electron tunnelling junction between the first and second electrodes. In other words, the antenna element comprises two electrically conductive electrodes and a nanometre scale insulating gap located somewhere between those two electrodes. The plurality of optical antenna elements may be configured such that the electromagnetic field of one optical antenna element spatially overlaps that of adjacent optical antenna elements and adjacent optical antenna elements are electromagnetically coupled to allow the plurality of optical antenna elements. Such an arrangement may ensure that the resulting structure acts as a plasmonic metamaterial. That plasmonic metamaterial may comprise an electromagnetic metamaterial. Appropriate arrangement of the optical antenna elements may allow the structure to act as a plasmonic metamaterial and overall sensitivity of a structure may stem from the sensitivity of strong plasmonic coupling between individual nanostructure elements in the metamaterial to external perturbations, for example, as a result of a physical or chemical environmental change. Aspects and embodiments described herein recognise that the optical properties of plasmonic systems and metamaterials based on the arrangement of plasmonic components present an opportunity to design novel optical and electrical devices which may offer useful properties. Electromagnetic metamaterial structures can exhibit high sensitivity to their surroundings and thus can offer a means to create various useful devices, including, for example sensitive detectors, sensors, modulators and light source elements. In one embodiment, the nanostructure elements are configured such that the electromagnetic field of one nanostructure element spatially overlaps that of adjacent nanostructure elements. Accordingly, rather than acting as separate component elements, the structure acts as a metamaterial. Arranging adjacent optical antenna elements to display strong near-field interaction may ensure that the resultant structure acts as a metamaterial As briefly mentioned above, the precise form of a structure in accordance with the first aspect may vary whilst retaining overall functional characteristics:

According to one embodiment, the plasmonic nanostructure element is integrally formed as part of one of the first and second electrodes. That is to say, the plasmonic nanostructure may itself be electrically conducting and act as one of the first and/or second electrodes. According to one embodiment, the electron tunnelling junction is formed between the plasmonic nanostructure element and one of the first and second electrodes. According to one embodiment, the optical antenna element comprises: two plasmonic nanostructure elements and the electron tunnelling junction is formed between the two plasmonic nanostructure elements.

According to one embodiment, the plasmonic metamaterial comprises one of: a visible-frequency metamaterial, a UV metamaterial or infrared metamaterial. On other words, the structure may act as a metamaterial in the visible part or in other parts of the electromagnetic spectrum. In one embodiment, the plasmonic metamaterial comprises an optical metamaterial. In one embodiment, the plasmonic metamaterial comprises an electromagnetic metamaterial. It will be appreciated that excitation of a plasmon may, depending on intended use of a structure, be achieved by means of appropriate radiation. Furthermore, it will be appreciated that a change to the structure can result in change in the optical, or other electromagnetic, properties of the metamaterial and therefore a change to reflection or transmission properties of the metamaterial may occur even off-resonance. In one embodiment, the plasmonic metamaterial comprises an optical metamaterial. Accordingly, providing incident energy in the form of, for example, photons, may excite surface plasmons. Whether a nanostructure is seen as a metamaterial is likely to depend upon the relative wavelength of the incident or resulting radiation in comparison to the spacing of adjacent nanostructure elements.

According to one embodiment, the plurality of optical antenna elements is configured as an array on a support. According to one embodiment, the array comprises a substantially regular array. Accordingly, that array may comprise a regular array or grid. In some embodiments, that array may comprise a quasi-regular array, such as a forest. Such a quasi-regular structure may result from structures being grown on, for example, a porous dielectric template. The pores of such a template may be located substantially regularly, as a result of employing a multi-step anodization process. In one embodiment, the array comprises a substantially regular array.

According to one embodiment, the plasmonic nanostructure elements comprise one or more of: an elongate element; a uniformly cross-sectioned rod; a cone; a tube, a dot or similar. It will be appreciated that various nanostructure elements may be used. In one embodiment, the nanostructure elements comprise a plasmonic material core. In one embodiment, the plasmonic material core comprises a hollow structure. That hollow structure may, for example, comprise a hollow tube. In one embodiment, the nanostructure elements comprise elongate elements extending from a support.

According to one embodiment, the plasmonic material comprises at least one of: gold, silver, aluminium, gallium, copper, doped semiconductor; or a topological insulator. Appropriate choice of plasmonic material may determine the nature of operation, for example, electromagnetic or optical response of the structure.

According to one embodiment, at least one of the first and second electrode is an electrode shared by more than one of the plurality of optical antenna elements. According to one embodiment, one of the first and second electrodes comprises at least one of: a liquid conductor; a conductive film, a conductive layer. According to one embodiment, each of the plurality of optical antenna elements has an individual first or second electrode.

According to one embodiment, at least one of the optical antenna elements comprise: a target-sensitive material located in the electron tunnelling junction. According to one embodiment, the target-sensitive material fills the electron tunnelling junction.

According to one embodiment, a plurality of the optical antenna elements comprise: a plasmonic nanostructure element comprising a target-sensitive coating. According to one embodiment, the target-sensitive material comprises: at least one of: a single molecule layer, single polymer layer. According to one embodiment, the structure comprises: a target sensitive material, located between adjacent optical antenna elements. It will be understood that the structure of the first aspect may be used in sensing or detection applications and/or devices. In some embodiments it is possible to provide the structure of the first aspect with a specific target sensitivity. That sensitivity may come from providing a target sensitive material in one or more of the tunnelling gaps provided by the optical antenna elements, and/or by providing for target sensitivity in the metamaterial formed by the plurality of adjacent optical antenna elements. In some embodiment, the optical antenna elements comprise a plasmonic material core having a target sensitive material coating. In one embodiment, the coating comprises a complete coating. In some embodiments, the coating may comprise a partial coating. In some embodiments only a proportion of said plasmonic material cores are coated in said target sensitive material. In one embodiment, the coating has a thickness a fraction of a nanometre to several hundred nanometres, that coating thickness being selected such that the thickness of the coating is less than half the spacing between individual optical antenna elements forming the metamaterial structure. The thickness of the coating may be chosen with a desired detector sensitivity and response time in mind. Too little target sensitive material may limit the impact of a target in a structure, meaning that the detector does not respond significantly to the presence of the target despite the exponential response of a tunnelling gap to changes. A target sensitive material may be provided within the gap of one or more of the optical antenna elements. That target sensitive material may fill the entire gap, may partially fill the gap, may be provided in all optical antenna element gaps, or a sub-set of said plurality of optical antenna element gaps.

According to one embodiment, the plasmonic metamaterial structure comprises: a light source configured to illuminate the plurality of optical antenna elements; and a current sensor, connected to the first and second electrodes and configured to detect any change in current induced in said plurality of optical antenna elements by the illumination. According to one embodiment, the plasmonic metamaterial structure comprises: a light source configured to illuminate the plurality of optical antenna elements and cause a change in current induced in said plurality of optical antenna elements. Accordingly, the sensor may be used as an optical detector or current modulator.

According to one embodiment, the plasmonic metamaterial structure comprises: a current sensor, connected to the first and second electrodes, configured to detect any change in current induced in the plurality of optical antenna elements. That change in current induced may be caused by a light signal to be detected or by other incident radiation illuminating said plurality of optical antenna elements.

According to one embodiment, the plasmonic metamaterial structure comprises: a voltage source connected to the first and second electrodes and configured to apply a bias voltage across the electrodes and a current sensor, connected to the first and second electrodes and configured to detect any change in current induced in the plurality of optical antenna elements. Accordingly, the voltage applied may be, in some arrangements, low (<0.5 V), thus ensuring no light emission, but allowing for improved collection efficiency of hot electrons of the structure.

According to one embodiment, the plasmonic metamaterial structure comprises: a voltage source connected to the first and second electrodes and configured to excite one or more of: plasmons and optical emission in the plurality of optical antenna elements; and an optical detector configured to detect any change in optical emission from the plurality of optical antenna elements. Accordingly, the structure may be used as an optical sensing platform or detector device. According to one embodiment, the optical detector comprises one of: a photo diode; a spectrometer.

According to one embodiment, the plasmonic metamaterial structure comprises: a voltage source connected to the first and second electrodes and configured to induce electron tunnelling in the plurality of optical antenna elements; and a current detector configured to detect any change in tunnelling current induced across the plurality of optical antenna elements. Accordingly, electrical input to the structure may be used to control an electrical output.

According to one embodiment, the plasmonic metamaterial structure comprises: a voltage source connected to the first and second electrodes and configured to induce electron tunnelling in the plurality of optical antenna elements. Accordingly, electrical input to the structure may be used to control an optical output.

A second aspect provides a method of forming a plasmonic metamaterial structure comprising a plurality of optical antenna elements, the method comprising: locating a plasmonic nanostructure element between a first and second electrode to form an electron tunnelling junction between the first and second electrodes; and configuring the plurality of optical antenna elements such that the electromagnetic field of one optical antenna element spatially overlaps that of adjacent optical antenna elements and adjacent optical antenna elements are electromagnetically coupled to allow the plurality of optical antenna elements to act as a plasmonic metamaterial.

According to one embodiment, the method comprises integrally forming the plasmonic nanostructure element as part of one of the first and second electrodes.

According to one embodiment, the plasmonic metamaterial comprises one of: a visible-frequency metamaterial, a UV metamaterial or infrared metamaterial.

According to one embodiment, the method comprises: forming the electron tunnelling junction between the plasmonic nanostructure element and one of the first and second electrodes.

According to one embodiment, the optical antenna element comprises: two plasmonic nanostructure elements and the method comprises forming the electron tunnelling junction between the two plasmonic nanostructure elements.

According to one embodiment, the method comprises configuring the plurality of optical antenna elements as an array on a support.

According to one embodiment, the array comprises a substantially regular array.

According to one embodiment, the plasmonic nanostructure elements comprise one or more of: an elongate element; a uniformly cross-sectioned rod; a cone; a tube.

According to one embodiment, the plasmonic material comprises at least one of: gold, silver, aluminium, gallium, copper, doped semiconductor; or a topological insulator.

According to one embodiment, at least one of the first and second electrode is an electrode shared by more than one of the plurality of optical antenna elements.

According to one embodiment, one of the first and second electrodes comprises at least one of: a liquid conductor; a conductive film, a conductive layer.

According to one embodiment, each of the plurality of optical antenna elements has an individual first or second electrode.

According to one embodiment, the method comprises locating a target-sensitive material in the electron tunnelling junction of at least one of the optical antenna elements.

According to one embodiment, the method comprises filling the electron tunnelling junction with the target-sensitive material.

According to one embodiment, a plurality of the optical antenna elements comprise: a plasmonic nanostructure element comprising a target-sensitive coating.

According to one embodiment, the target-sensitive material comprises: at least one of: a single molecule layer, single polymer layer.

According to one embodiment, the method comprises locating a target sensitive material between adjacent optical antenna elements.

According to one embodiment, the method comprises providing a light source and configuring the light source to illuminate the plurality of optical antenna elements; and providing a current sensor, connected to the first and second electrodes, and configuring the current sensor to detect any change in current induced in the plurality of optical antenna elements by the illumination.

According to one embodiment, the method comprises: providing a current sensor, connected to the first and second electrodes, and configuring the current sensor to detect any change in current induced in the plurality of optical antenna elements.

According to one embodiment, the method comprises: connecting a voltage source to the first and second electrodes and configuring the voltage source to apply a bias voltage across the electrodes; and providing a current sensor, connected to the first and second electrodes and configuring the current sensor to detect any change in current induced in the plurality of optical antenna elements.

According to one embodiment, the method comprises: connecting a voltage source to the first and second electrodes and configuring the voltage source to excite one or more of: plasmons and optical emission in the plurality of optical antenna elements; providing an optical detector and configuring the optical detector to detect any change in optical emission from the plurality of optical antenna elements.

According to one embodiment, the optical detector comprises one of: a photo diode; a spectrometer.

According to one embodiment, the method comprises: providing a voltage source and connecting the voltage source to the first and second electrodes and configuring the voltage source to induce electron tunnelling in the plurality of optical antenna elements; and providing a current detector and configuring the current detector to detect any change in tunnelling current induced across the plurality of optical antenna elements.

A third aspect provides a sensor comprising: a structure according to the first aspect. The sensor may comprise a hydrogen or oxygen sensor.

A fourth aspect provides a modulator comprising: a structure according to the first aspect.

A fifth aspect provides a light source comprising: a structure according to the first aspect. In some embodiments, the light source comprises a nanoscale light source.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

BRIEF DESCRIPTION OF THE DRAWINGS

Embodiments of the present invention will now be described further, with reference to the accompanying drawings, in which:

FIG. 1a illustrates schematically one possible fabrication method of an anodized aluminium oxide (AAO) template by the anodization of aluminium;

FIG. 1b illustrates schematically electrodeposition of gold into a porous AAO template such as that shown in FIG. 1a to form a gold nanorod array;

FIG. 1c illustrates schematically a high-angle ion milling process of a metamaterial surface;

FIG. 1d illustrates schematically one possible separated gold nanorod array comprising gold nanorod tips several nanometres lower than surrounding alumina;

FIG. 2a illustrates schematically a tunnelling-electron-driven plasmonic nanorod metamaterial structure based on air-gap tunnel junctions;

FIG. 2b illustrates schematically how diffusion or binding of molecules in air-gap tunnelling junctions may cause a change in a resulting emission spectrum;

FIG. 2c illustrates schematically a tunnelling-electron-driven plasmonic nanorod metamaterial structure based on polymer or molecule monolayer tunnel junctions;

FIG. 2d illustrates schematically how interaction of molecules with a monolayer of polymer or molecules in tunnel junctions may cause a change in a resulting emission spectrum;

FIG. 3a comprises a schematic diagram of possible fabrication steps;

FIG. 3b is a photograph of a plasmonic nanorod metamaterial with a one pound coin for size comparison purposes;

FIGS. 3c to 3e are photographs of fabrication steps showing ease of fabrication and compactness of one possible device;

FIG. 6a illustrates schematically one possible sensing setup;

FIG. 6b illustrates graphically recorded emission spectra ($V_b=2.5$ V) of a tunnelling-electron-driven plasmonic nanorod metamaterial structure based on PLH monolayer tunnel junctions when a surrounding chamber atmosphere is changed from $N_2$ to air;

FIG. 6c illustrates graphically recorded emission spectra ($V_b=2.5$ V) of an oxidized metamaterial structure when a surrounding chamber atmosphere is changed from air to 2% $H_2$;

FIG. 6d illustrates schematically reversibility and reproducibility of an optical sensor tested by cycling chamber atmosphere between air and 2% $H_2$ in $N_2$ ($V_b=2.5$ V);

DESCRIPTION OF THE EMBODIMENTS

Figure 1:
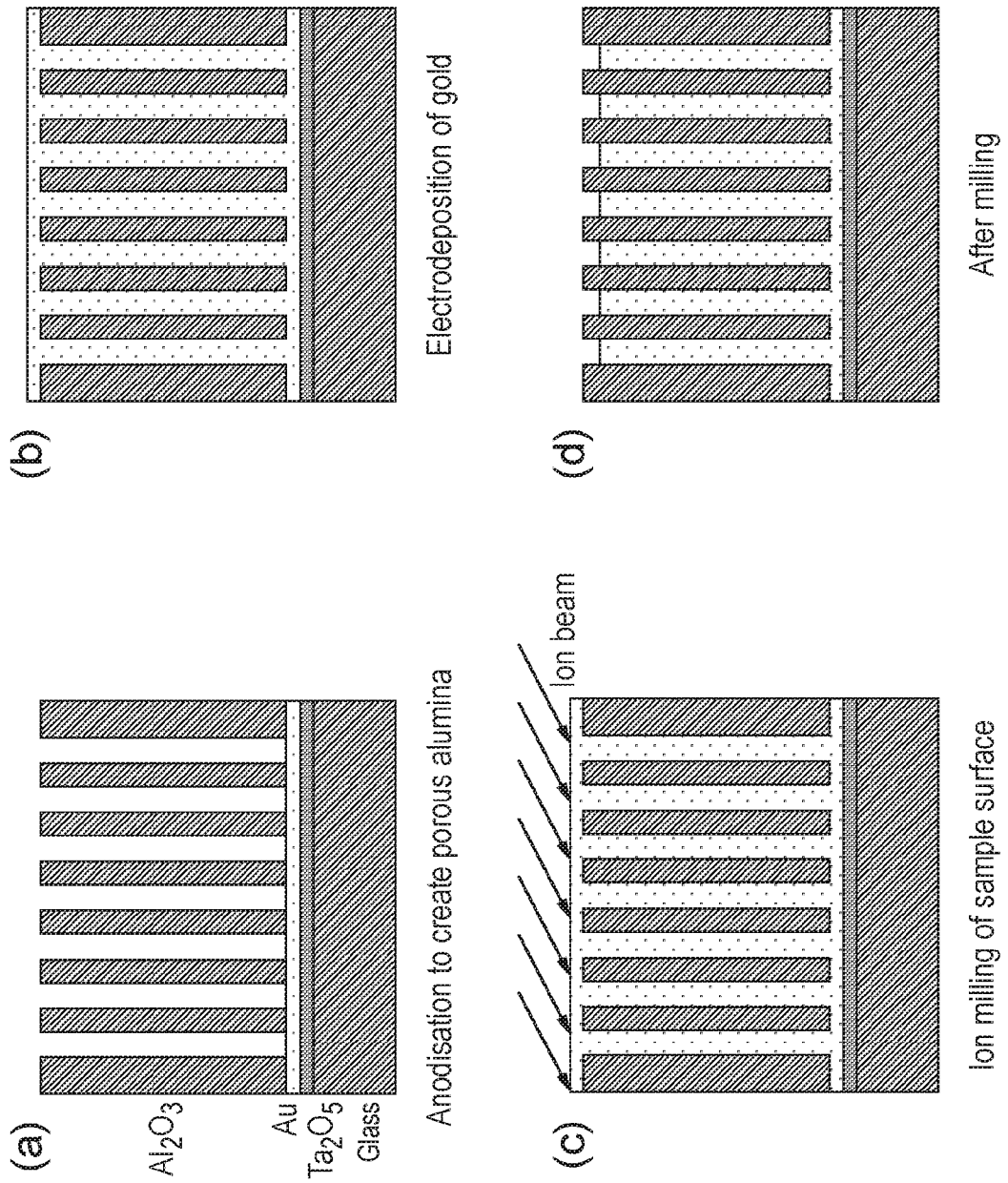
FIGS. 1a to 1d comprise a schematic illustration of one possible fabrication procedure for a gold nanorod based plasmonic metamaterial.

As described previously, applying a bias voltage between two electrodes separated by a nanometre-scale insulating gap, can cause a current to flow between the electrodes due to quantum mechanical electron tunnelling. The nature of that resulting current depends exponentially on insulating gap size and, as a result, even an atomic-level variation in the insulating gap size can produce measurable change in the tunnelling current. This principle is used in a scanning tunnelling microscope (STM), which can offer ultra-high spatial resolution if one of the electrodes is shaped to form a sharp tip and that tip is scanned across a sample surface (which forms the other electrode) [1].

The tunnelling current also depends on the electronic and structural properties of a medium which exists in the insulating gap.

As a result, tunnelling currents can be used as a highly sensitive mechanism for sensing applications; for example: probing molecule binding events in the junctions at a single-molecule level, studying fundamental interfacial processes, or detecting dynamic chemical reactions [2,3].

In 1976, Lambe and McCarthy discovered light generation from metal-insulator-metal tunnel junctions [4]. That phenomenon occurs due to excitation of surface plasmons in junctions by inelastic tunnelling of electrons. The phenomenon has been widely investigated using metal-insulator-metal structures and/or STM probes [5,6]. However, the electron-photon conversion efficiency is typically limited to around $10^{-5}$. It has been demonstrated that optical antennas can be used to strongly enhance electron-photon conversion efficiency and control related light emission on chip scale [7-9], which may open up opportunities for practical applications of tunnelling-electron-driven plasmonic devices.

Before describing particular arrangements in detail, an overview of structures according to a general arrangement is provided:

Plasmonic metamaterials may take various forms. For example, a plasmonic nanorod metamaterial may comprise an array of plasmonic material nanorods embedded or supported on a substrate. Such a metamaterial may display unique optical properties, for example: hyperbolic dispersion, negative refraction, and room-temperature nonlocal effects [10,11]. In a plasmonic nanorod metamaterial, each nanorod, having, for example, a diameter of tens of nanometres, may act perfectly both as a tunnel tip (like a STM probe) and an optical antenna, making a nanorod metamaterial an ideal platform to form tunnel junctions with another electrode positioned on the top to allow for high-efficiency and device-scale electrical excitation of plasmons.

Arrangements generally recognise that it may be possible to provide a new and versatile structure which can be configured to operate as a sensing platform. That structure may be based on tunnelling-electron-driven plasmonic nanorod metamaterials and designed and implemented to provide a structure having sensitive tunnel junctions, with compact size, ease of fabrication, and low cost. Example structures described below in relation to possible arrangements demonstrate oxygen and hydrogen sensing based on a tunnelling-electron-driven nanorod metamaterial with high sensitivity. The sensors demonstrated have excellent reversibility and reproducibility.

FIGS. 1a to 1d comprise a schematic illustration of one possible fabrication procedure for a gold nanorod based plasmonic metamaterial. Plasmonic nanorod metamaterials may be fabricated by electrodeposition of gold into porous anodized aluminium oxide (AAO) templates on a glass substrate.

FIG. 1a illustrates schematically one possible fabrication method of an anodized aluminium oxide (AAO) template by the anodization of aluminium: according to the method shown, a substrate-supported aluminium film is anodized in sulphuric or oxalic acid to create a porous AAO template.

FIG. 1b shows how an array of gold nanorods can be fabricated by electrodepositing gold into the pores of AAO template until a layer of gold film is formed on the top FIG. 1c illustrates schematically a high-angle ion milling process of a metamaterial surface: the nanorod metamaterial is ion-milled at high angle to remove the overgrown Au. Because the milling rate of gold is one order of magnitude faster than that of alumina, the tips of gold nanorods are several nanometres lower than the surround alumina after the milling, as shown in FIG. 1d.

Metamaterial structures such as those created by the manufacturing method may, in some arrangements, be put to use in sensing platforms. Possible optical sensing platforms can be based on tunnelling-electron-driven plasmonic nanorod metamaterials such as those resulting from the method illustrated schematically in FIG. 1.

Figure 2:
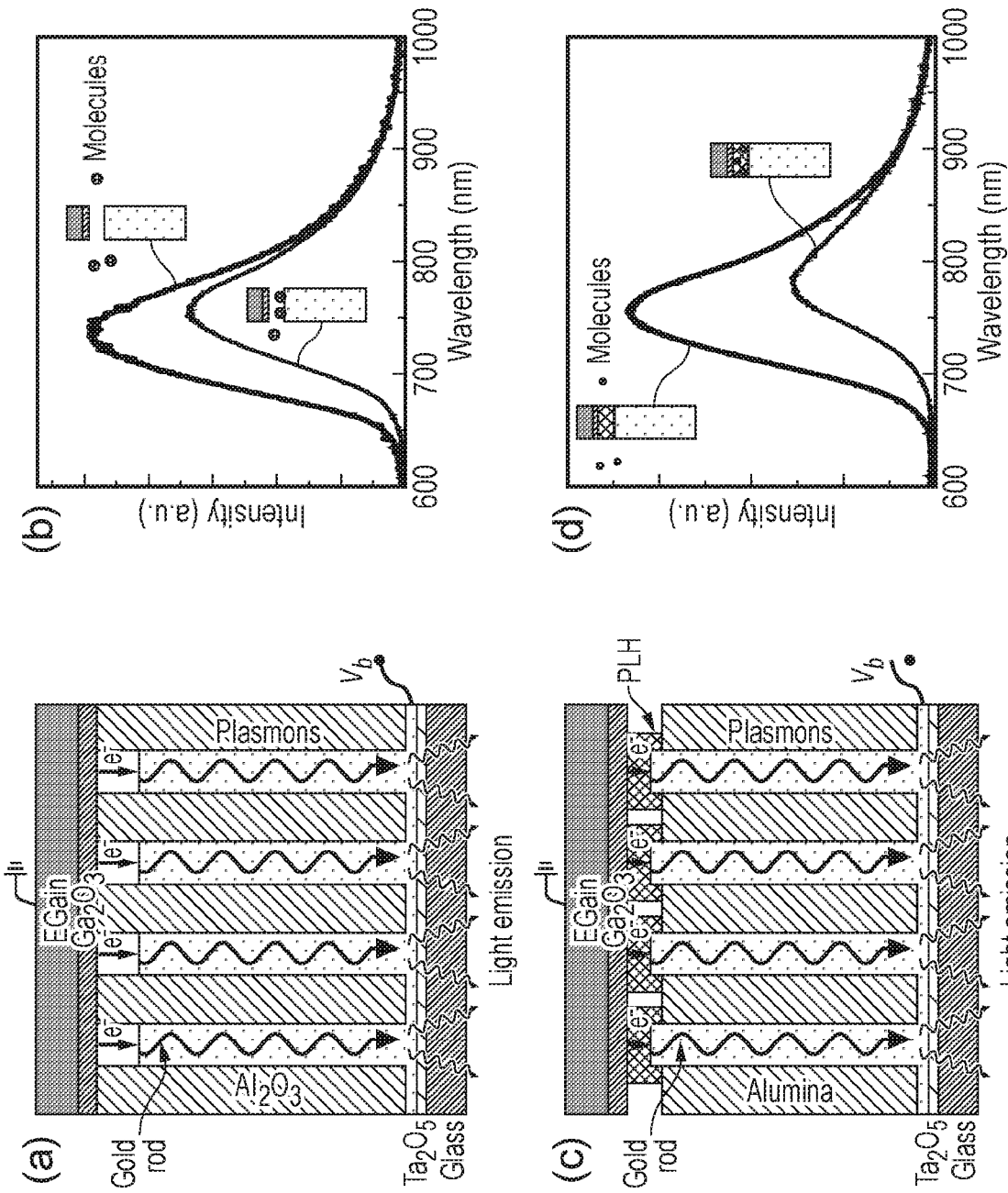
FIGS. 2a to 2d comprise a schematic illustration of a tunnelling-electron-driven plasmonic nanorod metamaterial structure according to one arrangement and an optical sensing platform and its sensing mechanism according to one arrangement.

One possible sensing application type can be based on air-gap tunnel junction metamaterial structures. FIG. 2a illustrates schematically a tunnelling-electron-driven plasmonic nanorod metamaterial structure based on air-gap tunnel junctions. As mentioned previously in relation to the method of manufacture, after high-angle ion milling, the tips of the gold nanorods may be several nanometres lower than the surrounding alumina, which results in a structure which is ideal for the construction of nanometre-scale air-gap-based tunnel junctions. It will be understood, for example, that the gold nanorods may act as one electrode and a second electrode may be positioned on the top of the structure, thus creating a plurality of air gaps/tunnelling junctions. In the example shown in FIG. 2, the second electrode is formed from liquid metal eutectic gallium indium (EGaIn) and forms a non-damaging, conformal top contact. By adding a droplet of EGaIn onto the metamaterial surface, a plurality of tunnel junctions can be formed between the nanorod tips and EGaIn. When a bias voltage is applied across the junctions, surface plasmons are formed in the tunnel junctions. Those plasmons subsequently couple into the gold nanorods and decay into photons at the substrate side of the metamaterial. Those photons produce a visible light emission spectrum as shown in FIG. 2b (black line).

When a molecule, for example a target molecule, diffuses into the tunnel junctions or binds onto the gold nanorod tips, it may cause a change in the tunnel current, and subsequently result in a change in the emission spectrum as shown in FIG. 2b (red curve).

FIG. 2c illustrates schematically a tunnelling-electron-driven plasmonic nanorod metamaterial structure based on polymer or molecule monolayer tunnel junctions which can be used in sensing applications. This type of metamaterial structure sensor is based on polymer or molecule monolayer tunnel junctions. An appropriate structure can be formed during a manufacturing process such as the one outlined in FIG. 1 by etching alumina surrounding the gold nanorods to make the alumina shorter than the nanorod tips. The exposed nanorod tips can be functionalised using, for example, a monolayer of polymer or molecules as a target sensitive substance. In the example shown in FIG. 2, poly-L-histidine (PLH) is used as the polymer monolayer. In order to form tunnelling junctions, a droplet of EGaIn is added to the structure. That droplet can act as an "upper" electrode.

It will be appreciated that in the case of gold nanorod metamaterial structures it is possible to take advantage of a vast toolkit afforded by well-established gold surface functionalization techniques. There is a broad choice of polymers and/or molecular materials available for functionalization, which may, in turn, greatly expand the capability and possible applications of a tunnelling-electron-driven metamaterial structure in relation to optical sensing.

In the arrangement shown in FIG. 2c when a bias voltage is applied, surface plasmons are formed in the tunnel junctions. Those surface plasmons subsequently couple into the gold nanorods and decay into photons at the substrate side of the metamaterial, producing a visible light emission spectrum as shown in FIG. 2d (black curve). When a target molecule diffuses into the tunnel junctions, it may interact with the monolayer provided on the functionalised gold rods, and cause a change in the tunnel current and subsequently a modification in the emission spectrum as shown in FIG. 2d (red curve).

It will be appreciated that hot electrons can be generated in the tunnel junctions due to the non-radiative decay of surface plasmons, which can make the tunnel junctions more reactive and thus expand the sensing capability of metamaterial structures used in sensing applications.

Use of tunnelling-electron-driven nanorod metamaterial structures has been demonstrated in relation to oxygen and hydrogen sensing applications utilizing PLH monolayer tunnel junctions.

It will be appreciated that fabrication of appropriate metamaterial structures may be simple and relatively low cost. In one example, a tunnelling-electron-driven plasmonic nanorod metamaterial structure may be fabricated in a manner which is easy and low cost: FIGS. 3a to 3e illustrate steps for one possible method of fabrication of a tunnelling-electron-driven plasmonic nanorod metamaterial structure.

Figure 3:
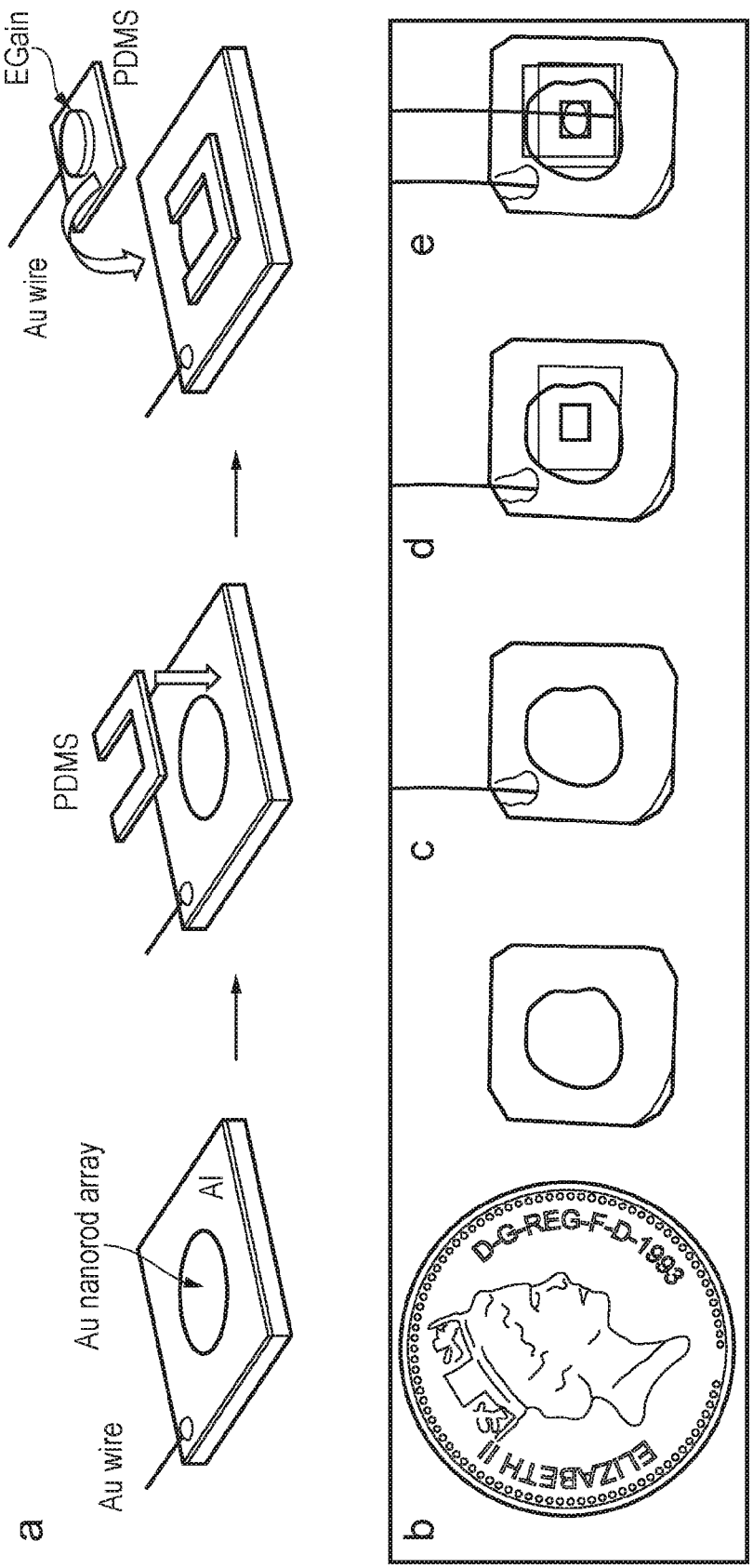
FIGS. 3a to 3e illustrate steps for one possible method of fabrication of a tunnelling-electron-driven plasmonic nanorod metamaterial structure.

FIG. 3a comprises a schematic diagram of possible metamaterial structure fabrication steps. In the example shown EGaIn is used as a top contact and PDMS slabs are used to confine the EGaIn droplet. The resulting structure and device can be highly compact as shown in FIGS. 3b to 3e which can offer advantages in relation to applications for such structures, for example, the miniaturization of optical sensors.

Figure 4:
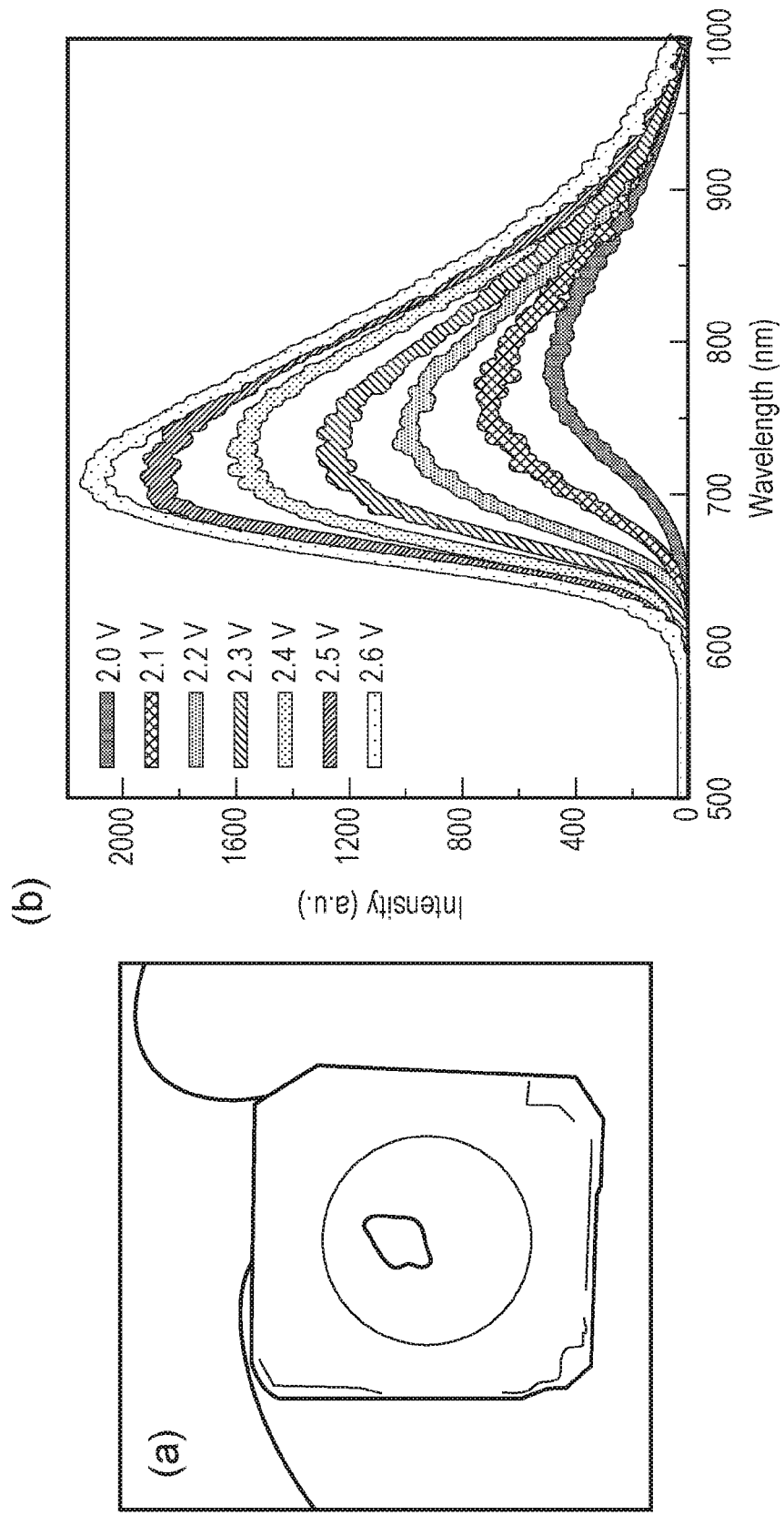
FIG. 4a is a photograph showing light emission from a tunnelling-electron-driven plasmonic nanorod metamaterial structure when a bias of $V_b=2.5$ V is applied.
FIG. 4b is a representation of measured emission spectra of one possible device as a function of applied forward bias.

As briefly mentioned above in relation to the arrangement shown in FIG. 2, a structure may be such that the application of a bias voltage between electrodes results in visible emission. In the example shown in FIG. 2, a bias voltage is applied between the gold nanorod tips and the EGaIn droplet, and visible red-colour light emission can be observed from the substrate side of the plasmonic nanorod metamaterial. FIG. 4a is a photograph showing light emission from a tunnelling-electron-driven plasmonic nanorod metamaterial structure when a bias of $V_b$=2.5 V is applied to a device such as that shown in FIG. 2. The area of the emission region is ~4 mm$^2$, and is defined by the contact area of top EGaIn electrode and the gold nanorods. As a result of the large number of effective tunnel junctions in the nanorod metamaterial (the nanorod areal density is as high as $10^{10}$ to $10^{11}$ cm$^{-2}$), the light emission from the structure on application of a bias voltage is visible by a naked eye, making the detection of signal very easy for optical sensing applications. FIG. 4b is a representation of measured emission spectra of one possible device as a function of applied forward bias.

Figure 5:
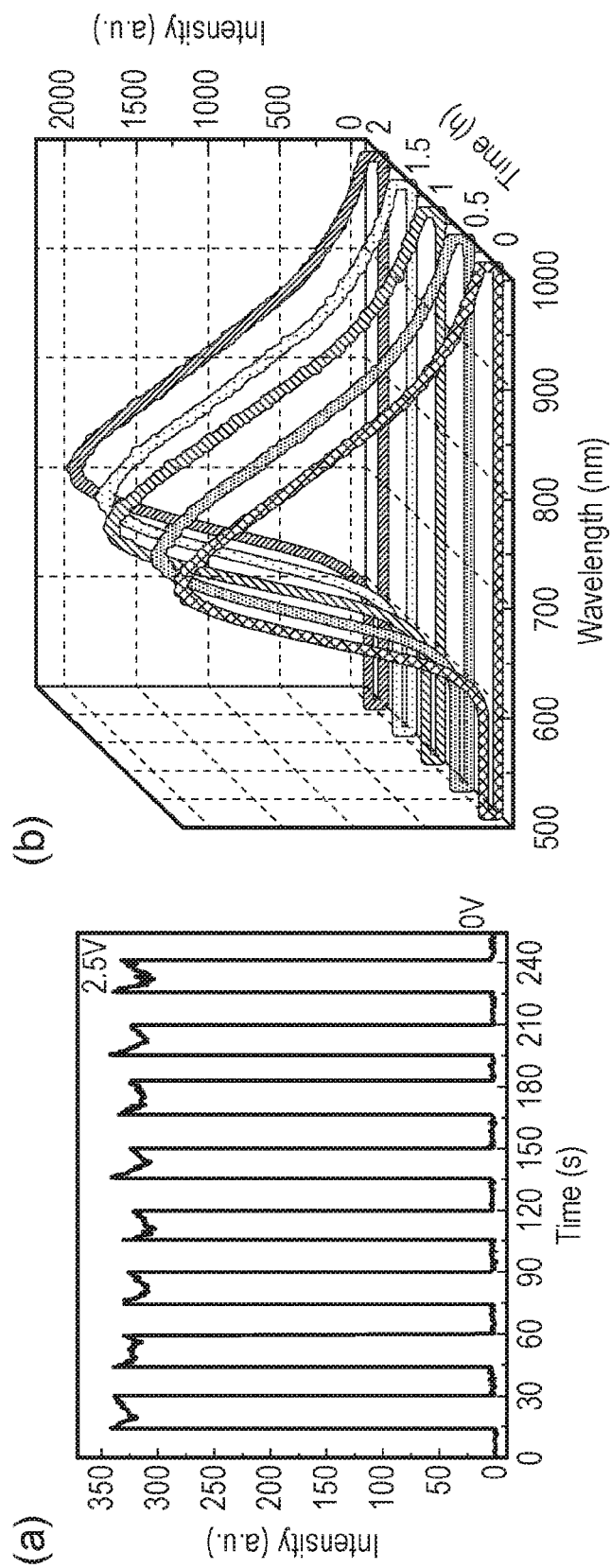
FIG. 5a illustrates schematically on-off stability of one possible device as forward bias is switched between 0 and 2.5 V.
FIG. 5b illustrates schematically time-dependent emission stability of one possible device when a 2.6 V forward bias is applied.

It will be appreciated that in relation to optical sensing applications, emission stability of a tunnelling-electron-driven plasmonic metamaterial structure is of significance. Arrangements which use the metamaterial structure for optical sensing platforms show good on-off stability and long-term operation stability. In particular, FIG. 5a illustrates schematically on-off stability of one possible device as forward bias is switched between 0 and 2.5 V; and FIG. 5b illustrates schematically time-dependent emission stability of one possible device when a 2.6 V forward bias is applied.

Figure 6:
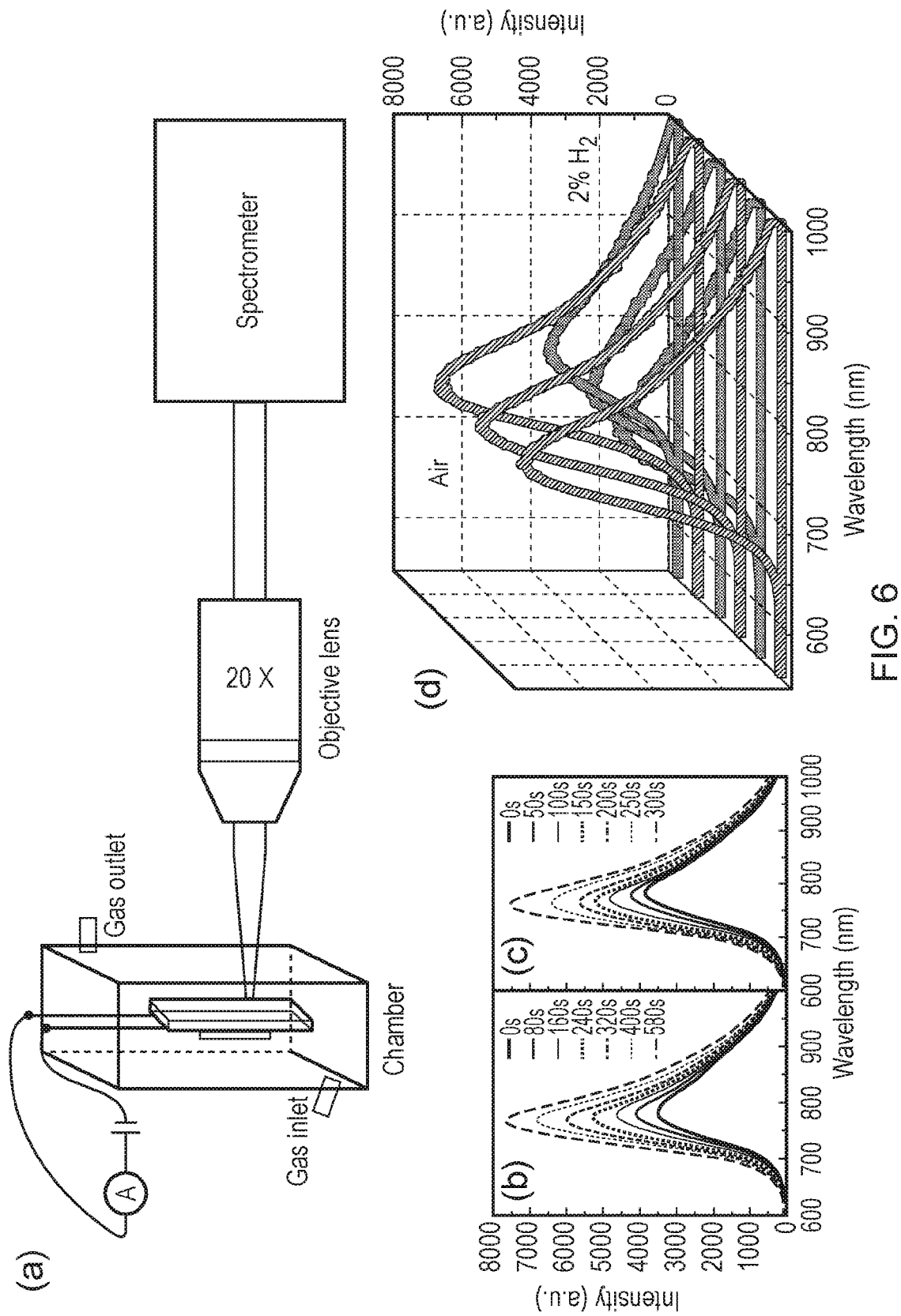
FIGS. 6a to 6d illustrate schematically oxygen and hydrogen sensing applications using tunnelling-electron-driven plasmonic nanorod metamaterial structures according to some arrangements.

FIGS. 6a to 6d illustrate schematically oxygen and hydrogen sensing applications using tunnelling-electron-driven plasmonic nanorod metamaterial structures according to some arrangements. FIG. 6 arrangements are based on PLH-monolayer tunnel junctions. The metamaterial structure being used as a sensor in the examples of FIG. 6 is sealed in a glass chamber and the tunnel current and emission spectrum are monitored simultaneously. FIG. 6a illustrates schematically one possible sensing setup.

FIG. 6b illustrates graphically recorded emission spectra ($V_b$=2.5 V) of a tunnelling-electron-driven plasmonic nanorod metamaterial structure based on PLH monolayer tunnel junctions when a surrounding chamber atmosphere is changed from N2 to air; FIG. 6c illustrates graphically recorded emission spectra ($V_b$=2.5 V) of an oxidized metamaterial structure when a surrounding chamber atmosphere is changed from air to 2% $H_2$; and FIG. 6d illustrates schematically reversibility and reproducibility of an optical sensor tested by cycling chamber atmosphere between air and 2% $H_2$ in $N_2$ ($V_b$=2.5 V). At the beginning of the test, the sensor is fresh and the chamber provides a pure $N_2$ atmosphere. Air is then slowly introduced into the chamber. As the air is introduced, the emission intensity can be seen to increase gradually and finally reach twice the original value (see FIG. 6b). From the response of the sensor to air and pure oxygen (measurements 40-75 in FIG. 7), it is possible to confirm that oxygen molecules are the specimen in air that cause the intensity change shown in FIG. 6b.

The emission response of the sensor to oxygen molecules is due to the hot electron mediated oxidization of PLH and/or Au in the tunnel junctions (superoxide radical, $O_2$—, is produced by transferring a hot electron from Au nanorod to the antibonding orbital of $O_2$, which can oxidize PLH and/or Au), which causes the change of tunnel current through the junctions and subsequently the emission intensity. In the case shown in FIG. 6, the metamaterial structure operates as an optical oxygen sensor.

If the oxidized sensor in air is exposed to 2% $H_2$ in $N_2$, it can be seen from FIG. 6c that the emission intensity decreases gradually, reducing to almost 50% of the original value where it saturates. It can be determined from the response of the sensor to pure $N_2$, 2% $H_2$ in $N_2$, and 2% $H_2$ in $N_2$ with 75% relative humidity (RH) (measurements 1-39 and 75-85 in FIG. 7), that the oxidized sensor is only sensitive to hydrogen. The emission response of the oxidized sensor to hydrogen molecules is due to the reduction of oxidized PLH and/or Au by hydrogen, which is mediated by the elevated temperature in the tunnel junctions due to the non-radiative decay of plasmons and the tunnelling of electrons. In this case, the metamaterial structure operates as a hydrogen sensor.

Figure 7:
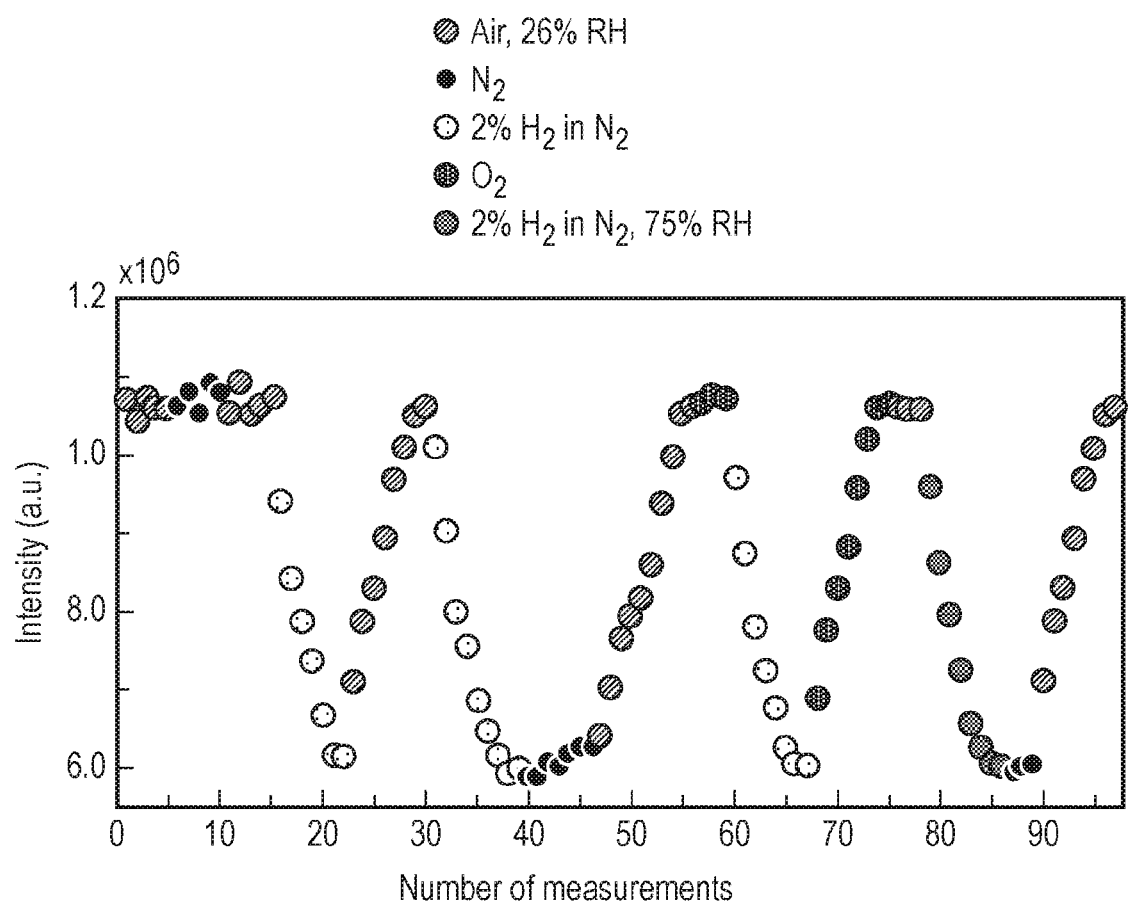
FIG. 7 illustrates schematically integrated emission power (recorded every 50 seconds) of a metamaterial structure when a surrounding chamber atmosphere is dynamically changed between air, $N_2$, 2% $H_2$ in $N_2$, $O_2$, and 2% $H_2$ in $N_2$ with 75% RH.

As illustrated in FIG. 6d and FIG. 7, the metamaterial structure being used as an oxygen sensor can be recovered by the flushing of hydrogen, whilst the metamaterial structure being used as a hydrogen sensor can be recovered by the flushing of oxygen. The oxygen and hydrogen optical sensors in the arrangement illustrated show good reversibility and reproducibility.

Figure 8:
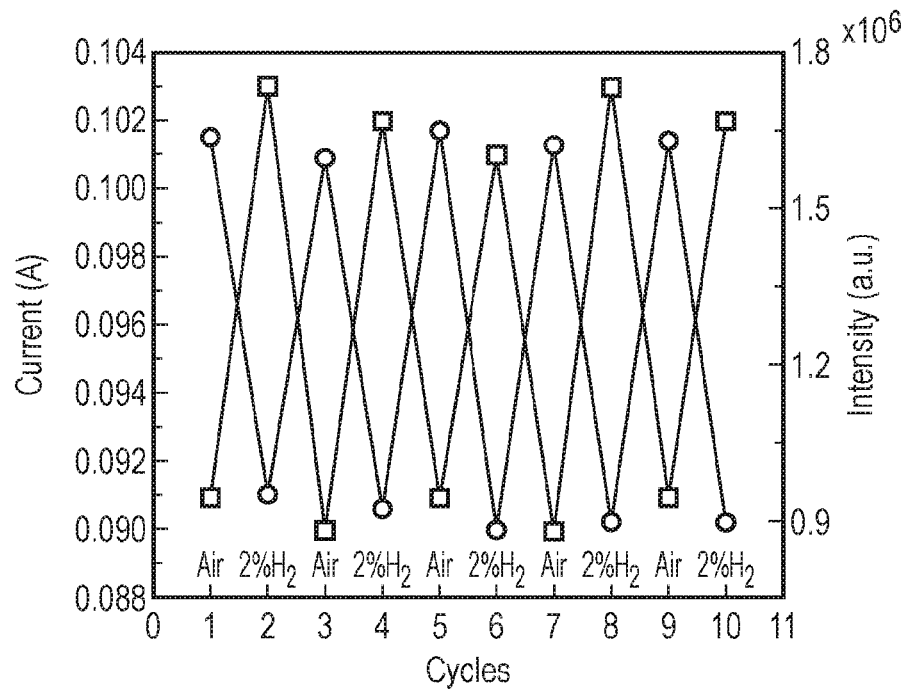
FIG. 8 illustrates schematically measured tunnelling current (hollow squares) and integrated emission power (hollow circles) when a surrounding chamber atmosphere is cycled between $N_2$ and 2% $H_2$ in $N_2$ ($V_b=2.5$ V)

FIG. 8 illustrates schematically measured tunnelling current (hollow squares) and integrated emission power (hollow circles) when a surrounding chamber atmosphere is cycled between $N_2$ and 2% $H_2$ in $N_2$ ($V_b$=2.5 V). Those Figures illustrate how a sensor formed from a metamaterial structure may respond both electrically and optically to changes in the tunnel junctions/gap between electrodes. In the illustrated arrangement, the tunnel junctions are exposed to oxygen and hydrogen molecules. Those molecules induce a detectable change. It can be seen that in the example illustrated, the sensitivity provided by optical scheme is about 5 times higher than sensitivity provided by the electrical scheme (~50% vs. 10% signal change).

Figure 9:
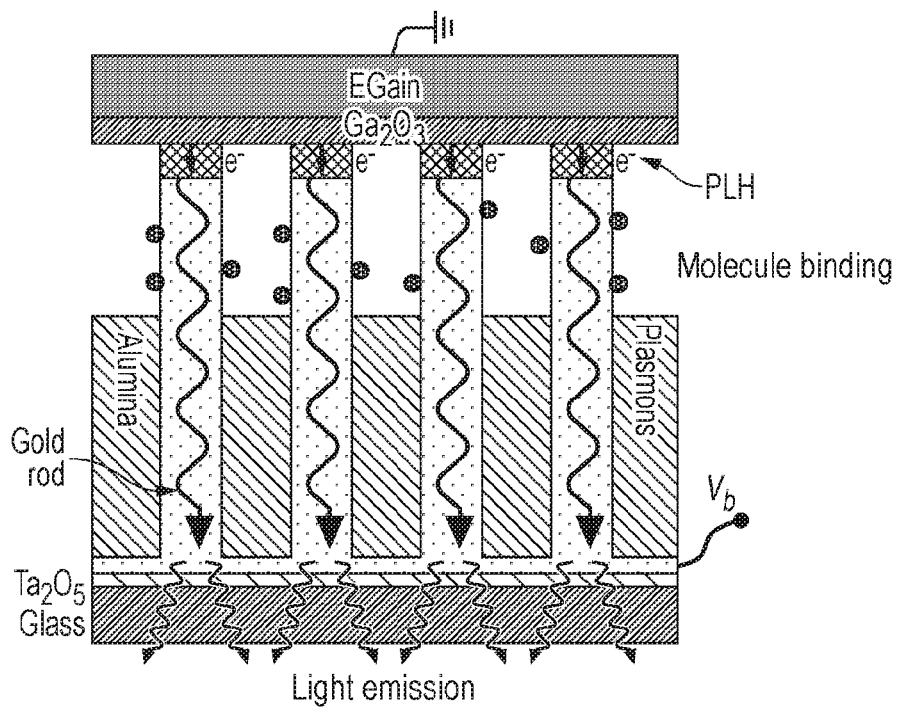
FIG. 9 illustrates schematically one possible compact plasmonic sensor based on a tunnelling-electron-driven plasmonic nanorod metamaterial structure according to one arrangement.

FIG. 9 illustrates schematically one possible compact plasmonic sensor based on a tunnelling-electron-driven plasmonic nanorod metamaterial structure according to one arrangement. In particular, the arrangement shown in FIG. 9 comprises an optical sensing platform based on a tunnelling-electron-driven plasmonic nanorod metamaterial structure which has been developed into a plasmonic sensor. That plasmonic sensor detects plasmonic resonance changes in gold nanorod arrays caused by the binding of molecules on nanorod side surfaces.

It will be appreciated that in the context of use of metamaterial structures for sensing applications, a structure in accordance with arrangements described herein can be excited directly by application of a bias voltage which can offer advantages compared to traditional plasmonic sensors which are typically excited by external and bulky light sources. Use of a miniaturized electrical excitation system, together with high sensitivity of, for example, nanorod metamaterial structures, to their surroundings, makes tunnelling-electron-driven plasmonic metamaterial structures an attractive platform for the development of plasmonic sensors.

Plasmonic metamaterial structures in accordance with arrangements have particular advantages in relation to sensing applications:

As set out above, a stimulus or target (oxygen and hydrogen molecules in the illustrative arrangements) can cause signal changes both in measured tunnel current and in emission spectrum of, for example, a tunnelling-electron-driven plasmonic nanorod metamaterial. That means that a sensing platform based on a plasmonic metamaterial structure, for example, a tunnelling-electron-driven plasmonic nanorod metamaterial, may combine the advantages of both electrical and optical sensing schemes, offering more options for signal retrieval from changes in parameters such as the tunnel current, emission intensity, or emission wavelength.

The tunnel current is very sensitive to the medium within the tunnel junctions. That sensitivity is such that the tunnelling current has sensitivity down to a single molecule level. As demonstrated above, the optical response of the tunnelling-electron-driven nanorod metamaterial to oxygen and hydrogen molecules is about 5 times higher than the electrical response, which means that a detection method based on optical signal changes may offer greater sensitivity.

Use of eutectic gallium indium droplets as top contacts in the example illustrative arrangements can help to make metamaterial structures, for example, tunnelling-electron-driven nanorod metamaterials, very compact. Also, compared to a traditional plasmonic sensor, a plasmonic metamaterial structure according to arrangements, such as the tunnelling-electron-driven plasmonic nanorod metamaterials described in preceding arrangements, are powered electrically, without the use of external bulky light sources for excitation, which can reduce the structural complexity and cost.

A plasmonic metamaterial structure can be fabricated using an electrochemical approach (anodization, electrodeposition, milling and etching) and may therefore be cheap to manufacture and readily scalable to any size.

A plasmonic metamaterial structure, for example, a tunnelling-electron-driven plasmonic nanorod metamaterial as described in relation to arrangements previously, may be reused in relation to different targets. Reuse for other stimulus or target detection may be achieved, for example, by oxygen plasma cleaning of appropriate nanostructure surfaces to remove, for example, a functionalized monolayer or bound molecules. Such surfaces may then be functionalized with, for example, a new monolayer.

A plasmonic metamaterial structure may be useful in sensing applications. Since such a sensor can be electrically powered and resulting emitted light is visible to naked eye, it is possible that in some arrangements, use of a simple detector could easily enable quantitative detection.

A plasmonic metamaterial structure being used in a sensing application may benefit from hot electrons generated by surface plasmons and well-established gold surface functionalization techniques. For example, tunnelling-electron-driven plasmonic nanorod metamaterial structures such as those described previously can be designed to transduce a variety of chemical and physical stimuli through choice of an appropriate monolayer of polymer or molecules. Furthermore, structures used in sensing applications may also be used to detect molecule binding or interfacial chemical reactions based on air gap tunnel junctions.

It will be appreciated that plasmonic metamaterial structures in accordance with some arrangements can be used to form part of an optical sensing platform. The sensing applications can be based on, for example, a tunnelling-electron-driven plasmonic nanorod metamaterial structure. The use of such structures has been shown to provide advantages such as: high sensitivity, ease of fabrication, high stability, and low cost.

Oxygen and hydrogen sensors based on an optical sensing application of an appropriate plasmonic metamaterial structure are described above. A plasmonic metamaterial structure may be used in other sensing applications, for example, the detection of other specimens that can bind onto the gold surface in the tunnel junctions.

An appropriate plasmonic metamaterial structure are described above can also be used for the detection of other specimens, for example, targets which cannot bind onto a functionalised surface. It is possible in some arrangements to design a sensing platform using a plasmonic metamaterial structure according to arrangements by choosing appropriate polymer or molecular materials that can react with or absorb a desired target, thus functionalising tunnel junctions within the structure.

An appropriate plasmonic metamaterial structure are described above can also be used for the detection of other physical stimuli, such as sound, ultrasound and temperature, with high sensitivity. Such physical stimuli may be detectable using the structure since, for example, an acoustic pressure exerted on an electrode, and/or a temperature change of the surrounding environment can change the dimensions of tunnel junctions within a structure slightly. A change to a tunnelling junction can consequently cause a change to the tunnel current and emission intensity.

Plasmonic metamaterial structures in accordance with arrangements, for example, the tunnelling-electron-driven plasmonic nanorod metamaterials described above, may also find application in other areas:

For example, if the tunnel junction includes or is filled with a monolayer polymer or molecular material which is light sensitive (i.e. a substance for which light illumination causes a structural change in the molecules), the tunnelling-electron-driven plasmonic nanorod metamaterial may be developed into an optical modulator.

Furthermore, it will be appreciated that rather than be used such that a bias voltage is constantly applied, a structure may work as a photodetector: when a plasmonic metamaterial structure is illuminated by appropriate light, it may excite surface plasmon resonance in the metamaterial and subsequently generate hot electrons in the nanostructure elements, which can, in turn, tunnel through the junction and be detected as a photocurrent.

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

REFERENCES

1. Binnig, G., Rohrer, H., Gerber, C. & Weibel, E. Surface studies by scanning tunnelling microscopy. Phys. Rev. Lett. 49, 57-61(1982).
2. Albrecht, T. Electrochemical tunnelling sensors and their potential applications. Nature Commun. 3:829 doi: 10.1038/ncomms1791 (2012).
3. Zhao, Y. et al. Single-molecule spectroscopy of amino acids and peptides by recognition tunnelling. Nature Nanotechnol. 9, 466-473 (2014).
4. Lambe, J. & McCarthy, S. L. Light emission from inelastic electron tunnelling. Phys. Rev. Lett. 37, 923-925 (1976).
5. Bharadwaj, P., Bouhelier, A. & Novotny, L. Electrical excitation of surface plasmons. Phys. Rev. Lett. 106, 226802 (2011).

6. Moal, E. L. et al. An electrically excited nanoscale light source with active angular control of the emitted light. Nano Lett. 13, 4198-4205 (2013).
7. Kern, J. et al. Electrically driven optical antennas. Nature Photon. 9, 582-586 (2015).
8. Parzefall, M. et al. Antenna-coupled photon emission from hexagonal boron nitride tunnel junctions. Nature Nanotechnol. 10, 1058-1063 (2015).
9. Bigourdan, F., Hugonin, J.-P., Marquier, F., Sauvan, C. & Greffet, J.-J. Nanoantenna for electrical generation of surface plasmon polaritons. Phys. Rev. Lett. 116, 106803 (2016).
10. Pollard, R. J. et al. Optical nonlocalities and additional waves in epsilon-near-zero metamaterials. Phys. Rev. Lett. 102, 127405 (2009).
11. Wurtz, G. A. et al. Designed ultrafast optical nonlinearity in a plasmonic nanorod metamaterial enhanced by nonlocality. Nature Nanotechnol. 2011, 6, 107-111.

The invention claimed is:

1. A plasmonic metamaterial structure comprising:
    a plurality of optical antenna elements comprising:
        a first electrode, a second electrode and a plasmonic nanostructure element located between the first electrode and the second electrode to form an electron tunnelling junction between the first electrode and the second electrode; and
        the plurality of optical antenna elements positioned with respect to each other such that an electromagnetic field of a given optical antenna element spatially overlaps that of adjacent optical antenna elements and the adjacent optical antenna elements are electromagnetically coupled to allow the plurality of optical antenna elements to act as a plasmonic metamaterial and wherein at least one of the plurality of optical antenna elements comprises a target-sensitive material located in the electron tunnelling junction.

2. The plasmonic metamaterial structure according to claim 1, wherein the plasmonic nanostructure element is integrally formed as part of one of the first electrode or the second electrode.

3. The plasmonic metamaterial structure according to claim 1, wherein the plasmonic metamaterial comprises one of: a visible-frequency metamaterial, a UV metamaterial, or infrared metamaterial.

4. The plasmonic metamaterial structure according to claim 1, wherein the electron tunnelling junction is formed between the plasmonic nanostructure element and one of the first electrode or the second electrode.

5. The plasmonic metamaterial structure according to claim 1, wherein the given optical antenna element comprises two plasmonic nanostructure elements and the electron tunnelling junction is formed between the two plasmonic nanostructure elements.

6. The plasmonic metamaterial structure according to claim 1, wherein the plurality of optical antenna elements form an array on a support.

7. The plasmonic metamaterial structure according to claim 6, wherein the array comprises a substantially regular array.

8. The plasmonic metamaterial structure according to claim 1, wherein the plasmonic nanostructure element comprises one or more of: an elongate element, a uniformly cross-sectioned rod, a cone, or a tube.

9. The plasmonic metamaterial structure according to claim 1, wherein the plasmonic material comprises at least one of: gold, silver, aluminium, gallium, copper, doped semiconductor, or topological insulator.

10. The plasmonic metamaterial structure according to claim 1, wherein at least one of the first electrode and the second electrode is an electrode shared by more than one of the plurality of optical antenna elements.

11. The plasmonic metamaterial structure according to claim 10, wherein the first electrode and the second electrode comprise at least one of: a liquid conductor, a conductive film, or a conductive layer.

12. The plasmonic metamaterial structure according to claim 1, wherein each of the plurality of optical antenna elements comprises an individual first electrode or an individual second electrode.

13. The plasmonic metamaterial structure according to claim claim 1, wherein the target-sensitive material fills the electron tunnelling junction.

14. The plasmonic metamaterial structure according to claim 1, wherein the plasmonic nanostructure element comprises a target-sensitive coating.

15. The plasmonic metamaterial structure according to claim claim 1, wherein the target-sensitive material comprises at least one of: a single molecule layer, or a single polymer layer.

16. The plasmonic metamaterial structure according to claim 1, wherein a target sensitive material is located between adjacent optical antenna elements.

17. The plasmonic metamaterial structure according to claim 1, comprising:
    a light source to illuminate the plurality of optical antenna elements; and
    a current sensor, connected to the first electrode and the second electrode, wherein the current sensor detects any change in current induced in the plurality of optical antenna elements when illuminated by the light source.

18. The plasmonic metamaterial structure according to claim 1, comprising:
    a voltage source connected to the first and second electrodes and configured to apply a bias voltage across the electrodes; and
    a current sensor, connected to the first and second electrodes and configured to detect any change in current induced in the plurality of optical antenna elements.

19. A method of forming a plasmonic metamaterial structure comprising a plurality of optical antenna elements, the method comprising:
    locating a plasmonic nanostructure element between a first electrode and a second electrode to form an electron tunnelling junction between the first electrode and the second electrode;
    positioning the plurality of optical antenna elements such that an electromagnetic field of a given optical antenna element spatially overlaps that of adjacent optical antenna elements and the adjacent optical antenna elements are electromagnetically coupled to allow the plurality of optical antenna elements to act as a plasmonic metamaterial; and
    locating a target-sensitive material in the electron tunnelling junction of at least one of the plurality of optical antenna elements.

* * * * *